(12) United States Patent
Cheng

(10) Patent No.: US 9,952,280 B2
(45) Date of Patent: *Apr. 24, 2018

(54) ELECTRONIC DEVICE WITH CHIP-ON-FILM PACKAGE

(71) Applicant: Novatek Microelectronics Corp., Hsinchu (TW)

(72) Inventor: Jhih-Siou Cheng, New Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 69 days.

This patent is subject to a terminal disclaimer.

(21) Appl. No.: 15/180,069

(22) Filed: Jun. 12, 2016

(65) Prior Publication Data

US 2016/0291087 A1   Oct. 6, 2016

Related U.S. Application Data

(62) Division of application No. 13/939,189, filed on Jul. 11, 2013, now Pat. No. 9,400,310.

(30) Foreign Application Priority Data

Dec. 24, 2012  (TW) .............................. 101149600 A

(51) Int. Cl.
    *G01R 31/28*     (2006.01)
    *G01R 31/317*    (2006.01)

(52) U.S. Cl.
    CPC ...... *G01R 31/2896* (2013.01); *G01R 31/2884* (2013.01); *G01R 31/2894* (2013.01); *G01R 31/3172* (2013.01)

(58) Field of Classification Search
    None
    See application file for complete search history.

(56) References Cited

U.S. PATENT DOCUMENTS 6,326,553 B1 * 12/2001 Yim .................... G11B 5/40
                                                174/254
7,298,164 B2 * 11/2007 Chen .................. G09G 3/006
                                                324/760.01

* cited by examiner

*Primary Examiner* — Paresh Patel
(74) *Attorney, Agent, or Firm* — JCIPRNET

(57) ABSTRACT

An electronic device with COF package is provided. The electronic device includes a flexible substrate, a core circuit unit, multiple output pads and multiple switching elements. First terminals of the switching elements are respectively and electrically connected to output pads of the core circuit unit, and second terminals of the switching elements are respectively and electrically connected to the output pads. In a test stage of the electronic device, the switching elements are sequentially turned on such that one of multiple output signals of the core circuit unit is transmitted to a common test pad outside of the electronic device through corresponding one of the output pads.

9 Claims, 8 Drawing Sheets

|  | Switching Element 140a | Switching Element 140b | Switching Element 140c |
|---|---|---|---|
| Test Time t1 | ON | OFF | OFF |
| Test Time t2 | OFF | ON | OFF |
| Test Time t3 | OFF | OFF | ON |

FIG. 2

|  | Switching Element 140a | Switching Element 140b | Switching Element 140c | Switching Element 140d | Switching Element 140e | Switching Element 140f | Switching Element 140g | Switching Element 140h | Switching Element 140i |
|---|---|---|---|---|---|---|---|---|---|
| Test Time t1 | ON | OFF | OFF | ON | OFF | ON | OFF | OFF | OFF |
| Test Time t2 | OFF | ON | OFF | OFF | ON | OFF | ON | OFF | OFF |
| Test Time t3 | OFF | OFF | ON | ON | OFF | OFF | OFF | ON | OFF |
| Test Time t4 | ON | OFF | OFF | OFF | ON | OFF | OFF | OFF | ON |

FIG. 5

| | Input Switching Element 180a | Input Switching Element 180b | Input Switching Element 180c | Input Switching Element 180d | Input Switching Element 180e | Input Switching Element 180f | Input Switching Element 180g |
|---|---|---|---|---|---|---|---|
| Input Time T1 | ON | OFF | OFF | OFF | OFF | ON | OFF |
| Input Time T2 | OFF | ON | OFF | OFF | OFF | OFF | ON |
| Input Time T3 | OFF | OFF | ON | OFF | OFF | ON | OFF |
| Input Time T4 | OFF | OFF | OFF | ON | OFF | OFF | ON |
| Input Time T5 | OFF | OFF | OFF | OFF | ON | ON | OFF |

FIG. 7

ELECTRONIC DEVICE WITH CHIP-ON-FILM PACKAGE

CROSS-REFERENCE TO RELATED APPLICATION

This application is a divisional application of and claims the priority benefit of a prior application Ser. No. 13/939,189, filed on Jul. 11, 2013, now allowed. The prior application Ser. No. 13/939,189 claims the priority benefit of Taiwan application Ser. No. 101149600, filed on Dec. 24, 2012. The entirety of each of the above-mentioned patent applications is hereby incorporated by reference herein and made a part of this specification.

BACKGROUND OF THE INVENTION

1. Field of the Invention

The present invention relates to an electronic device, and more particularly, to an electronic device with chip-on-film package.

2. Description of Related Art

Ever-advancing wafer fabrication technology has led to rapid development of integrated circuit (IC) industry. ICs fabricated are lighter in weight, smaller in size, more complex and versatile in functions and have higher pin count and higher frequency. Chip-on-film (COF) package satisfies the packing requirements of the ICs fabricated in accordance with this development trend. The COF package can have a fine pitch and good flexibility, which has a good performance in size stability, line high density, flame resistance, and environment protection.

As a result, IC test has been more and more difficult, and workload of IC test is taking a larger proportion in the entire IC fabrication. In the test of high pin count ICs, especially the test of multiple series-connected COF package ICs, the large quantity of input and output terminals has become a bottle neck for the compatibility of testers. System resources of the tester may not be enough to cope with the test of high pin count IC.

If the compatibility of the IC tester cannot keep pace with the IC development, the IC tester is bound to be replaced. However, the fabrication cost is a key factor to obtain competitive advantage in the market.

SUMMARY OF THE INVENTION

Accordingly, the present invention is directed to an electronic device with chip-on-film (COF) package which may reduce the number of the test pads and hence increase the compatibility of the tester by outputting multiple output signals to the test pads in a time-division multiplexing and many-to-one manner.

The present invention provides an electronic device with COF package. The electronic device includes a flexible substrate, a core circuit unit, multiple output pads and multiple switching elements. The core circuit unit is disposed in the flexible substrate. The output pads are disposed in the flexible substrate and include a first output pad and a second output pad. The switching elements include a first switching element and a second switching element. A first terminal and a second terminal of the first switching element are electrically connected to a first output terminal of the core circuit unit and the first output pad, respectively, and a first terminal and a second terminal of the second switching element are electrically connected to a second output terminal of the core circuit unit and the second output pad, respectively. In a test stage of the electronic device, the switching elements are sequentially turned on such that one of multiple output signals of the core circuit unit is transmitted to the common test pad outside of the electronic device through corresponding one of the output pads.

In view of the foregoing, in various embodiments of the present invention, in the test stage, the multiple switching elements are controlled to sequentially turn on so as to alternatively transmit the multiple output signals of the core circuit unit disposed in the non-cutting-out area to the common test pads disposed in the cutting-out area, thereby achieving the test operation in the time-division multiplexing and many-to-one manner, thus reducing the number of the test pads and increasing the compatibility of the tester to the electronic device.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

FIG. 2 illustrates state change of the switching elements of the electronic device in the test stage according to one embodiment of the present invention.

FIG. 5 illustrates state change of the switching elements of the electronic device of FIG. 4 in the test stage according to one embodiment of the present invention.

FIG. 7 illustrates state change of the input switching elements of the electronic device of FIG. 6 in the test stage according to one embodiment of the present invention.

DESCRIPTION OF THE EMBODIMENTS

Figure 1:
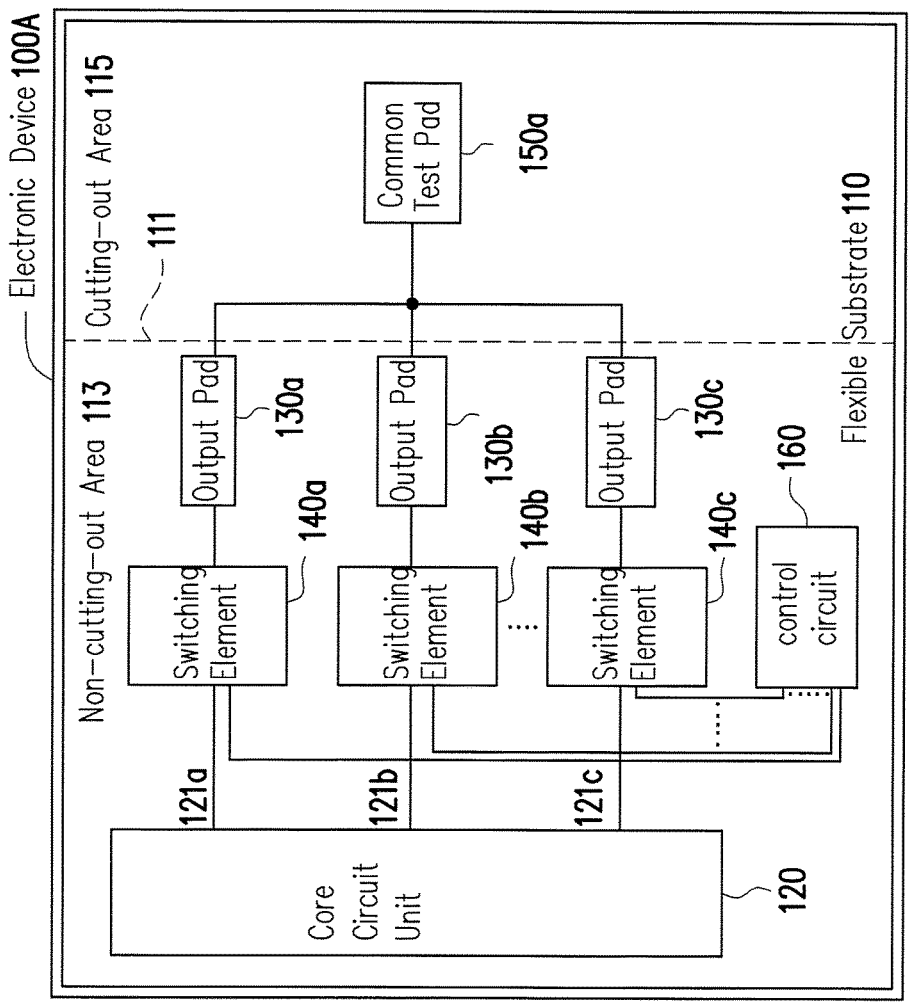
FIG. 1 illustrates an electronic device with chip-on-film package according to one embodiment of the present invention.

FIG. 1 illustrates an electronic device with chip-on-film package according to one embodiment of the present invention. Referring to FIG. 1, the electronic device 100A has a chip-on-film (COF) package and includes a flexible substrate 110, a core circuit unit 120, a plurality of output pads (e.g. a first output pad 130a, a second output pad 130b and a n-th output pad 130c), a plurality of switching elements (e.g. a first switching element 140a, a second switching element 140b and a n-th switching element 140c), a common test pad 150a, and a control circuit 160. In some embodiments, the core circuit unit 120 is an internal circuit of the COF package, and the switching elements 140a to 140c and the control circuit 160 are disposed outside the COF package. In other embodiments, the core circuit unit 120, the switching elements 140a to 140c and the control circuit 160 are all disposed inside the COF package.

A first terminal and a second terminal of the first switching element 140a are electrically connected to a first output terminal 121a of the core circuit unit 120 and the first output pad 130a, respectively. By analogy, a first terminal and a second terminal of the n-th switching element 140c are electrically connected to a n-th output terminal 121c of the core circuit unit 120 and the n-th output pad 130c. The common test pad 150a is electrically connected to the output pads 130a to 130c. While FIG. 1 only illustrates three output pads and three switching elements of the electronic device 100A, it is to be understood that this should not be regarded as limiting. Rather, the electronic device 100A of the present embodiment can have another number of the output pads and the switching elements. In addition, the switching elements 140a to 140c may be implemented as tri-stage buffers or transmission gates. The control circuit 160 may be implemented as a control chip, a microprocessor or another control device.

A cut line 111 divides the flexible substrate 110 into a non-cutting-out area 113 and a cutting-out area 115. The core circuit unit 120, the output pads 130a to 130c, the switching elements 140a to 140c, and the control circuit 160 are disposed in the non-cutting-out area 113, while the common test pad 150a is disposed in the cutting-out area 115. In this embodiment, the electronic device 100A can selectively operate in a normal operation stage or a test stage. In the test stage, the non-cutting-out area 113 and the cutting-out area 115 have not been cut apart. Therefore, a tester may test functionalities of the core circuit unit 120 by using a probe contacting the common test pad 150 (which will be detailed later). In general, the common test pad 150 has a larger area than each output pad 130 for facilitating the tester placing the probe. After the test stage ends, the flexible substrate 110 may be cut along the cut line 111 to remove the cutting-out area 115. After the cutting-out area 115 is removed, the flexible substrate 110 may be coupled to a printed circuit board, a display panel or any other type of mainboard (not shown). That is, the core circuit unit 120 of the non-cutting-out area 113 may be electrically connected to the mainboard via the output pads 130a to 130c. As such, in the normal operation stage, the core circuit unit 120 may output signals to the mainboard through the output pads 130a to 130c.

In the test stage, the common test pad 150a in the cutting-out area 115 has not been cut out. At this time, the control circuit 160 outputs multiple control signals to control the switching units 140a to 140c, respectively, such that the switching elements 140a to 140c are sequentially turned on and hence a corresponding one of signals of the output terminals 121a to 121c of the core circuit unit 120 is transmitted to the common test pad 150a.

For example, FIG. 2 illustrates state change of the switching elements of the electronic device 100A of FIG. 1 in the test stage according to one embodiment of the present invention. Referring to FIG. 1 and FIG. 2, in order for the tester to read out a signal of the first output terminal 121a of the core circuit unit 120 at a test time t1, the control unit 160 outputs multiple control signals to control the switching elements such that the switching element 140a is turned on to allow the signal of the first output terminal 121a to be outputted to the common test pad 150a while the remaining switching elements 140b, 140c are turned off. When the switching elements 140b, 140c are turned off, the switching element 140b, 140c can provide a high-impedance (usually denoted by "Z") state to avoid signal interference between the output terminals 121a to 121c of the core circuit unit 120. In order for the tester to read out a signal of the second output terminal 121b of the core circuit unit 120 at a test time t2, the control unit 160 outputs multiple control signals to control the switching elements such that the switching element 140b is turned on to allow the signal of the second output terminal 121b to be outputted to the common test pad 150a while the remaining switching elements 140a, 140c are turned off to provide a high-impedance state to avoid signal interference between the output terminals 121a to 121c of the core circuit unit 120. By analogy, in order for the tester to read out a signal of the third output terminal 121c of the core circuit unit 120 at a test time t3, the switching element 140c is turned on to allow the signal of the n-th output terminal 121c to be outputted to the common test pad 150a while the remaining switching elements 140a, 140b are turned off. Therefore, the tester can read out the signals of the multiple output pads 130a to 130c using one single common test pad 150a, thereby reducing the overall number of the test pads and hence increasing the compatibility of the corresponding tester. It should be understood that the sequence in which the switching elements 140a to 140c are turned on may be determined according to actual test requirements and should not be limited to the particular sequence as illustrated herein.

In the normal operation stage, the common test pad 150a in the cutting-out area 115 and associated parallel paths have been removed. The control circuit 160 can output multiple control signals to control the switching elements 140a to 140c to turn on at the same time in the normal operation stage. Therefore, the mainboard (not shown) may obtain the signals of the output terminals 121a to 121c of the core circuit unit 120 through the corresponding output pads 130a to 130c.

In this embodiment, the output terminals of the switching elements 140a to 140c may be electrically connected to the common test pad 150a through different film leads. However, film leads used for signal transmission inside the electronic device 100A usually have a small size. As a result, in the normal operation stage, if there are no output pads 130a to 130c, the film leads are not practically suitable for outputting to an outside of the electronic device 100A. Therefore, in the present embodiment, each different film lead may be provided with the output pad 130a to 130c, such that, the output signals of the core circuit unit 120 may be outputted to the outside through the corresponding output pads in the normal operation stage.

FIG. 3A, FIG. 3B, FIG. 3C, FIG. 3D and FIG. 3E are circuit diagrams of the switching elements of the electronic device of FIG. 1 according to different embodiments of the present invention. Relevant descriptions of the switching elements 140 of FIG. 3A, FIG. 3B, FIG. 3C, FIG. 3D and FIG. 3E may be referred to for an understanding of implementations of the switching elements 140a to 140c of FIG. 1.

Figure 3A:
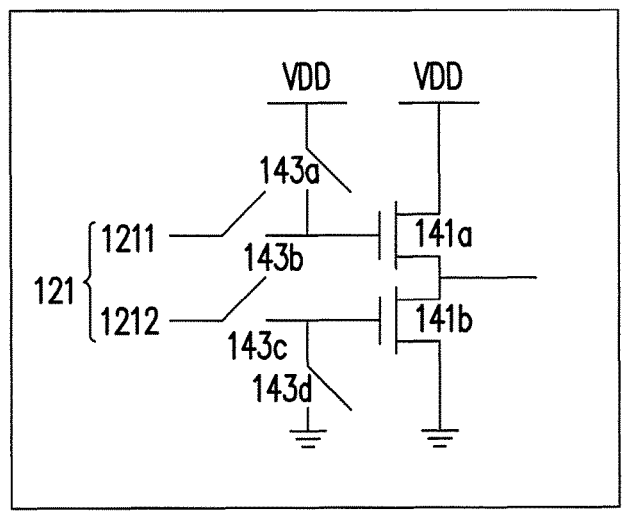
FIG. 3A, FIG. 3B, FIG. 3C, FIG. 3D and FIG. 3E illustrates switching elements of the electronic device according to other embodiments of the present invention.

Referring to FIG. 3A, the switching element 140 may include a first transistor 141a, a second transistor 141b, a first switch 143a, a second switch 143d, a third switch 143b, and a fourth switch 143c. In the present embodiment, the first transistor 141a is, for example, a p-channel metal oxide semiconductor (PMOS) transistor, and the second transistor 141b is, for example, an N-channel metal oxide semiconductor (NMOS) transistor. In the switching element 140 of FIG. 3A, a first terminal (e.g. source) of the first transistor 141a is coupled to a system voltage VDD, and a second terminal (e.g. drain) of the first transistor 141a is coupled to a corresponding output pad (e.g. one of the output pads 130a to 130c of FIG. 1). A first terminal (e.g. drain) of the second transistor 141b is coupled to the second terminal of the first transistor 141a, and a second terminal (e.g. source) of the second transistor 141b is coupled to a ground voltage. A first terminal of the first switch 143a is coupled to the system voltage VDD, and a second terminal of the first switch 143a is coupled to a control terminal (e.g. gate) of the first transistor 141a. A first terminal of the second switch 143d is coupled to a control terminal (e.g. gate) of the second transistor 141b, and a second terminal of the second switch 143d is coupled to the ground voltage. In the present embodiment, the output terminal 121 (e.g. one of the output terminals 121a to 121c of FIG. 1) of the core circuit unit 120 includes sub-output terminals 1211 and 1212. A first terminal of the third switch 143b is coupled to the sub-output terminal 1211 of the core circuit unit 120, and a second terminal of the third switch 143b is coupled to the control terminal of the first transistor 141a. A first terminal of the fourth switch 143c is coupled to the control terminal of the second transistor 141b, and a second terminal of the fourth switch 143c is coupled to the sub-output terminal 1212 of the core circuit unit 120.

Referring to FIG. 3A, when the control circuit (e.g. the control circuit 160 of FIG. 1) controls the switching element 140 to turn off by means of a control signal, the control circuit controls the switching element such that the first switch 143a and the second switch 143d are turned on, while the third switch 143b and the fourth switch 143c are turned off. At this time, both the first transistor 141a and the second transistor 141b are turned off, thus resulting in a high-impedance state of the switching element 140. When the control circuit (e.g. the control circuit 160 of FIG. 1) controls the switching element 140 to turn on by means of a control signal, the first switch 143a and the second switch 143d are turned off, while the third switch 143b and the fourth switch 143c are turned on, such that the signal of the output terminal 121 of the core circuit unit (e.g. the core circuit unit 120 of FIG. 1) is transmitted to a corresponding output pad (e.g. one of the output pads 130a to 130c of FIG. 1).

Figure 3B:
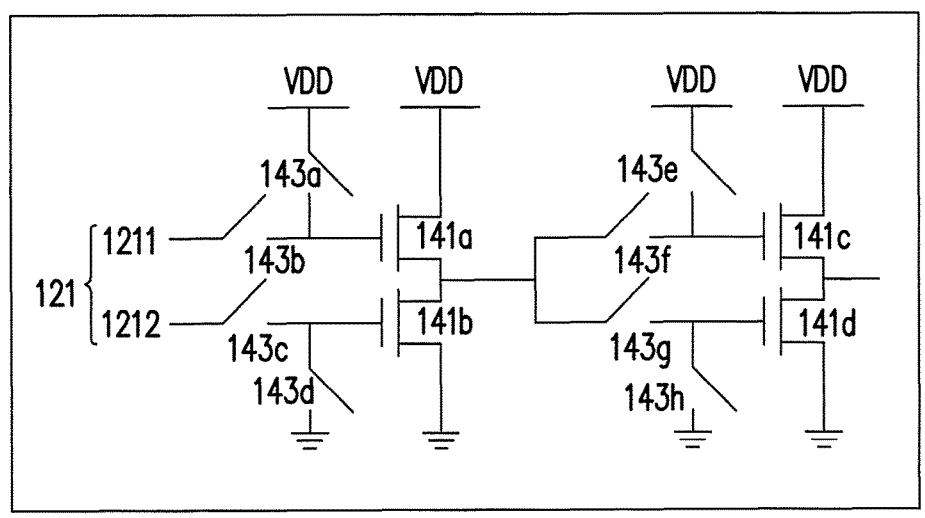

In another embodiment of the present invention, implementation of the switching element 140 is shown in FIG. 3B. In comparison with the switching element 140 of FIG. 3A, the switching element 140 of FIG. 3B further includes a third transistor 141c, a fourth transistor 141d, a fifth switch 143e, a sixth switch 143h, a seventh switch 143f, and an eighth switch 143g. In this embodiment, the third transistor 141c is, for example, a PMOS transistor, and the fourth transistor 141d is, for example, an NMOS transistor. In the switching element 140 of FIG. 3B, the first terminal (e.g. source) of the first transistor 141a is coupled to the system voltage VDD, the first terminal (e.g. drain) of the second transistor 141b is coupled to the second terminal (e.g. drain) of the first transistor 141a, and the second terminal (e.g. source) of the second transistor 141b is coupled to the ground voltage. The first terminal of the first switch 143a is coupled to the system voltage VDD, the second terminal of the first switch 143a is coupled to the control terminal (e.g. gate) of the first transistor 141a. The first terminal of the first switch 143a is coupled to the system voltage VDD, and the second terminal of the first switch 143a is coupled to the control terminal (e.g. gate) of the first transistor 141a. The first terminal of the second switch 143d is coupled to the control terminal (e.g. gate) of the second transistor 141b, and the second terminal of the second switch 143d is coupled to the ground voltage. In the present embodiment, the output terminal 121 (e.g. one of the output tell finals 121a to 121c of FIG. 1) of the core circuit unit 120 includes sub-output terminals 1211 and 1212. The first terminal of the third switch 143b is coupled to the sub-output terminal 1211 of the core circuit unit 120, and the second terminal of the third switch 143b is coupled to the control terminal of the first transistor 141a. The first terminal of the fourth switch 143c is coupled to the control terminal of the second transistor 141b, and the second terminal of the fourth switch 143c is coupled to the sub-output terminal 1212 of the core circuit unit 120.

A first terminal (e.g. source) of the third transistor 141c is coupled to the system voltage VDD, and a second terminal (e.g. drain) of the third transistor is coupled to one corresponding output pad (e.g. one of the output pads 130a to 130c of FIG. 1). A first terminal (e.g. drain) of the fourth transistor 141d is coupled to the second terminal of the third transistor 141c, and a second terminal (e.g. source) of the fourth transistor 141d is coupled to the ground voltage. A first terminal of the fifth switch 143e is coupled to the system voltage VDD, and a second terminal of the fifth switch 143e is coupled to a control terminal (e.g. gate) of the third transistor 141c. A first terminal of the sixth switch 143h is coupled to a control terminal (e.g. gate) of the fourth transistor 141d, and a second terminal of the sixth switch 143h is coupled to the ground voltage. A first terminal of the seventh switch 143f is coupled to the second terminal of the first transistor 141a, and a second terminal of the seventh transistor 143f is coupled to the control terminal of the third transistor 141c. A first terminal of the eighth switch 143g is coupled to the control terminal of the fourth transistor 141d, and a second terminal of the eighth switch 143g is coupled to the second terminal of the first transistor 141a.

Referring to FIG. 3B, when the control circuit (e.g. the control circuit 160 of FIG. 1) controls the switching element 140 to turn off by means of a control signal, the control circuit controls the switching element such that the first switch 143a is turned on, the second switch 143d is turned on, the third switch 143b is turned off, the fourth switch 143c is turned off, the fifth switch 143e is turned off, the sixth switch 143h is turned on, the seventh switch 143f is turned off, and the eighth switch 143g is turned off. At this time, the first transistor 141a, the second transistor 141b, the third transistor 141c and the fourth transistor 141d are all turned off, thus resulting in a high-impedance state of the switching element 140. When the control circuit (e.g. the control circuit 160 of FIG. 1) controls the switching element 140 to turn on by means of a control signal, the control circuit controls the switching element such that the first switch 143a is turned off, the second switch 143d is turned off, the third switch 143b is turned on, the fourth switch 143c is turned on, the fifth switch 143e is turned off, the sixth switch 143h is turned off, the seventh switch 143f is turned on, and the eighth switch 143g is turned on. As such, the signal of the output terminal 121 of the core circuit unit (e.g. the core circuit unit 120 of FIG. 1) is transmitted to one corresponding output pad (e.g. one of the output pads 130a to 130c of FIG. 1).

Figure 3C:
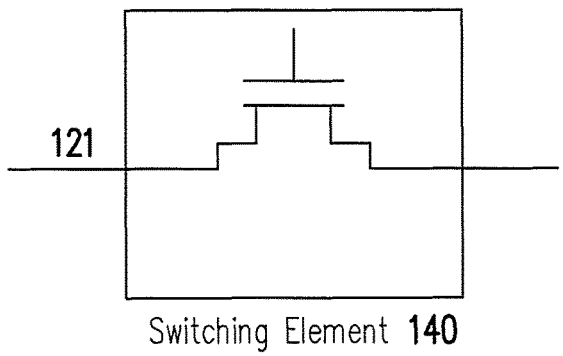
Figure 3D:
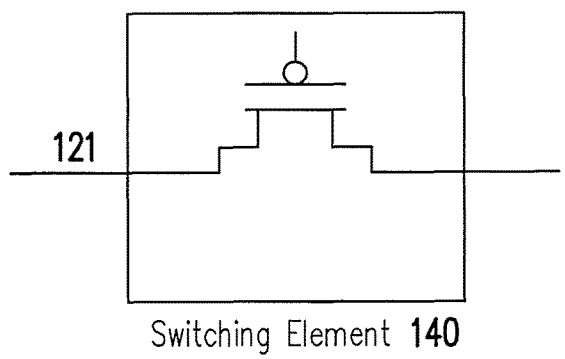
Figure 3E:
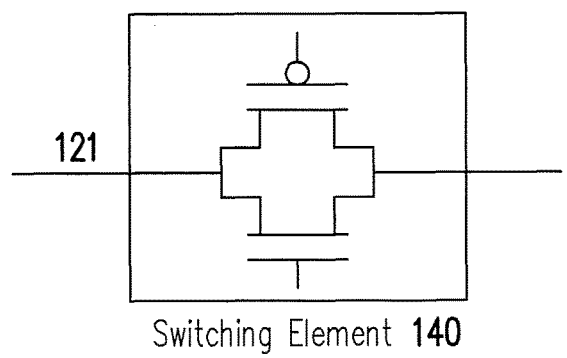

In addition, in another embodiment of the present invention, the switching element 140 may be a PMOS transistor (as shown in FIG. 3D), an NMOS transistor (as shown in FIG. 3C) or a transmission gate (as shown in FIG. 3E). Similarly, in the embodiment of FIG. 3C, FIG. 3D or FIG. 3E, the control circuit may control the switching element 140 by means of the control signal. The switching element 140 that is turned off is in the high-impedance state. The switching element 140 that is turned on may transmit the signal of the output terminal 121 of the core circuit unit to one corresponding output pad.

Figure 4:
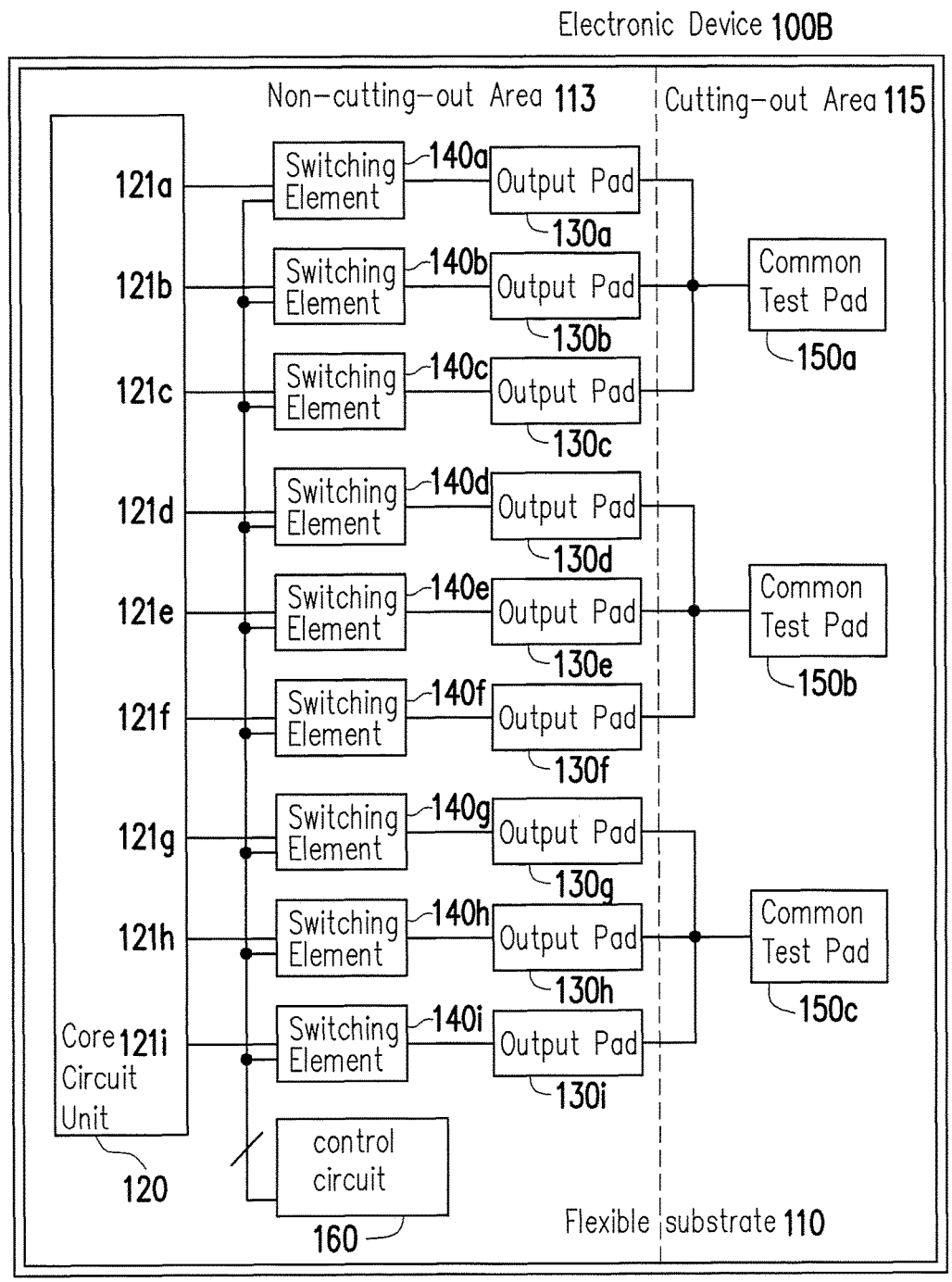
FIG. 4 illustrates an electronic device with chip-on-film package according to another embodiment of the present invention.

FIG. 4 illustrates an electronic device with chip-on-film package according to another embodiment of the present invention. Referring to FIG. 4, in the present embodiment, the electronic device 100B may include multiple common test pads 150a, 150b, 150c. The embodiment of FIG. 5 may be configured by analogy with the relevant description with respect to FIG. 1, FIG. 2, and FIG. 3. In the test stage, the common test pad 150a in the cutting-area 115 and associated parallel paths have not been removed and, as such, the control circuit 160 outputs multiple control signals to control the switching elements 140a to 140c, the switching elements 140d to 140e, and the switching elements 140f to 140i to sequentially turn on, such that signals of the output terminals of the core circuit unit 120 are sequentially and respectively transmitted to the common test pads 150a to 150c. Therefore, the tester obtains outputs of the electronic device 100B through the common test pads 150a, 150b, and 150c at different times to verify functionalities of the core circuit unit 120.

For example, FIG. 5 illustrates state change of the switching elements of the electronic device 100B of FIG. 5 in the test stage according to one embodiment of the present invention. Referring to FIG. 4 and FIG. 5, at a test time t1, the control unit 160 outputs multiple control signals to control the switching elements such that the first switching element 140a, the fourth switching element 140d and the sixth switching element 140f are turned on to allow the signals of the first output terminal 121a, the fourth output terminal 121d and the sixth output terminal 121f to be respectively outputted to the common test pads 150a, 150b, and 150c. At the test time t1, the control unit 160 controls the switching elements such that the remaining switching elements to turn off to avoid signal interference between the output terminals 121a to 121c of the core circuit unit 120. Similarly, at a test time t2, the control unit 160 controls the switching elements 140a to 140i such that the signals of the second output terminal 121b, the fifth output terminal 121e and the seventh output terminal 121g are respectively transmitted to the common test pads 150a, 150b and 150c. At a test time t3, the control unit 160 controls the switching elements 140a to 140i such that the signals of the third output terminal 121c, the fourth output terminal 121d and the eighth output terminal 121h are respectively transmitted to the common test pads 150a, 150b and 150c. At a test time t4, the control unit 160 controls the switching elements 140a to 140i such that the signals of the first output terminal 121a, the fifth output terminal 121e and the ninth output terminal 121i are respectively transmitted to the common test pads 150a, 150b and 150c. As such, the output signals of the output terminals of the core circuit unit 120 are tested/verified in a time-division multiplexing and many-to-one manner through the common test pads, thereby reducing the overall number of the test pads and hence increasing the compatibility of the corresponding tester. Here, the sequence of the different test times t1, t2, t3, t4 can be determined according to actual test requirements.

After the test stage ends, the flexible substrate 110 may be cut along the cut line 111 to remove the cutting-out area 115. After the cutting-area 115 is removed, the flexible substrate 110 may be coupled to a printed circuit board, a display panel or any other type of mainboard (not shown) through the output pads 130a to 130c. In the normal operation stage, the common test pads 150a to 150c in the cutting-out area 115 and associated parallel paths have been removed, and the control circuit 160 outputs multiple control signals to control the first to ninth switching elements 140a to 140i to turn on, such that the mainboard may obtain the signals of the output terminals 121a to 121i of the core circuit unit 120 through the first to ninth output pads 130a to 130i, respectively.

However, the correspondence between the common test pads and the output terminals of the core circuit unit may be determined according to actual requirements. For example, in another embodiment, the common test pad 150a may be connected to the switching elements 140b, 140d and 140f to receive the output signals of the output terminals 121b, 121d and 121f, respectively; the common test pad 150b may be connected to the switching elements 140g and 140h to receive the output signals of the output terminals 121g and 121h, respectively; and the common test pad 150c may be connected to the switching elements 140a, 140c, 140e and 140i to receive the output signals of the output terminals 121a, 121c, 121e and 121i, respectively.

In another embodiment of the present invention, the electronic device may be a driver IC with high pin count. For example, the pin count of the electronic device 100 may include, but not limited to, one thousand. In some embodiments, the core circuit unit 120 may be a source driver IC which transmits a driving signal to a display panel through the output pad.

Figure 6:
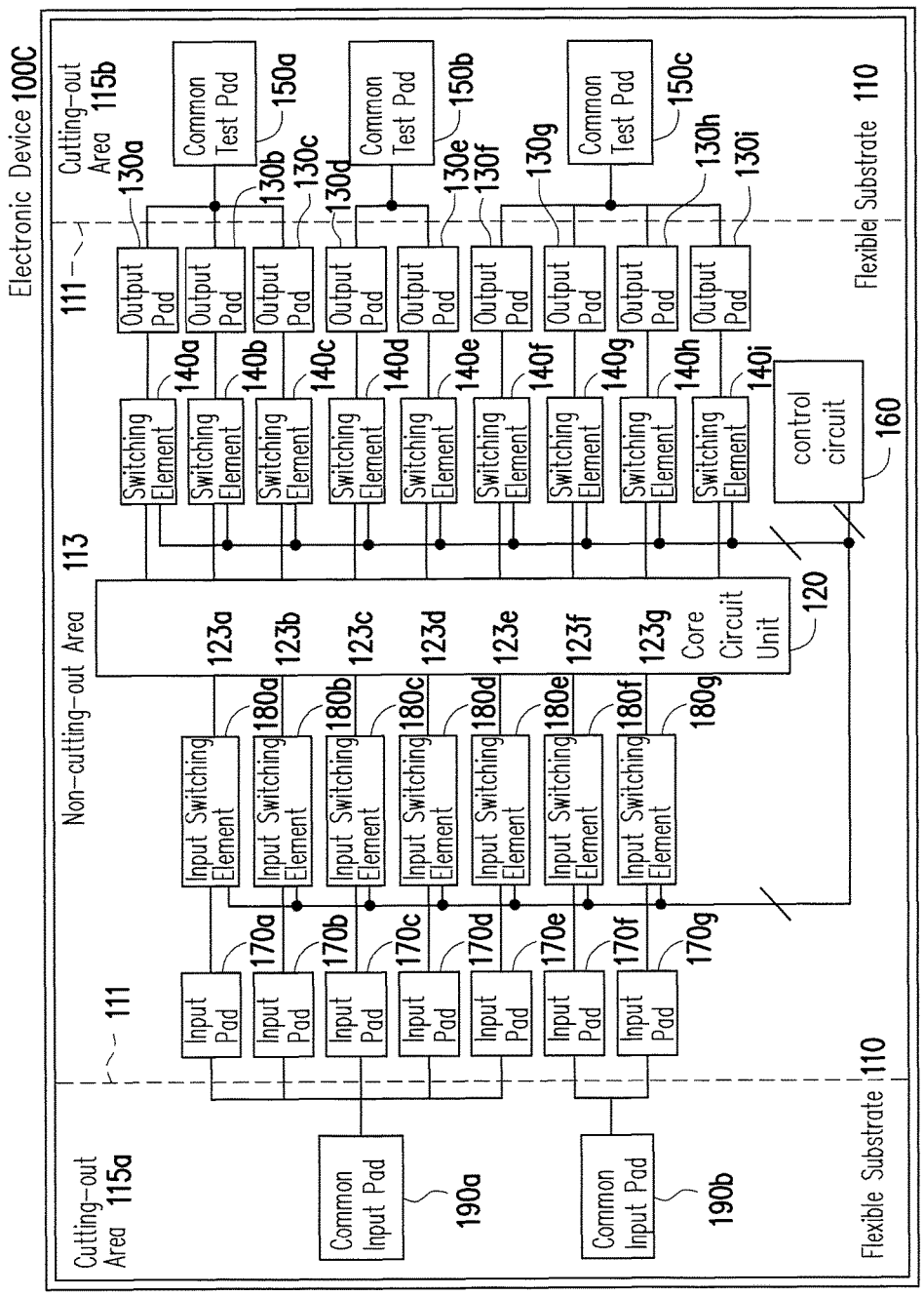
FIG. 6 illustrates an electronic device with chip-on-film package according to another embodiment of the present invention.

FIG. 6 illustrates an electronic device with chip-on-film package according to another embodiment of the present invention. The embodiment of FIG. 6 may be configured by analogy with the relevant description with respect to FIG. 1, FIG. 2, and FIG. 3A to FIG. 3E, FIG. 4 and FIG. 5. Different from the embodiment of FIG. 4, the electronic device 100C of the embodiment of FIG. 6 further includes first to seventh input pads 170a to 170g, first to seventh input switching elements 180a to 180g, and common input pads 190a and 190b. The common input pad 190a is electrically connected to the first to fifth input pads 170a to 170e, and the common input pad 190b is electrically connected to the sixth input pad 170f and the seventh input pad 170g. First terminals of the first to seventh input switching elements 180a to 180g are electrically connected to first to seventh input terminals 123a to 123g of the core circuit unit 120, respectively. Second terminals of the first to seventh input switching elements 180a to 180g are electrically connected to the first to seventh input pads 170a to 170g, respectively.

In the present embodiment, a cut line 111 divides the flexible substrate 110 into a non-cutting-out area 113 and cutting-out areas 115a and 115b. The first to seventh input pads 170a to 170g and the first to seventh input switching elements 180a to 180g are disposed in the non-cutting-out area 113, while the common input pads 190a and 190b are disposed in the cutting-out area 115b. Likewise, in the present embodiment, the electronic device 100C can selectively operate in a normal operation stage or a test stage. In the test stage, the common input pads 190a and 190b in the cutting-out area 115b have not been cut out and, as such, the control circuit 160 outputs multiple control signals to control the first to fifth input switching elements 180a to 180e to sequentially turn on, and to control the sixth and seventh switching elements 180f and 180g to sequentially turn on, such that signals of the common input pads 190a and 190b are transmitted to corresponding input terminals of the core circuit unit 120. Therefore, the tester may input the test signal (or a test pattern) to the core circuit unit 120 of the electronic device 100C at different times through the common input pads 190a and 190b for functionality verification of the core circuit unit 120.

Specifically, FIG. 7 illustrates state change of the input switching elements of the electronic device 100C of FIG. 6 in the test stage according to one embodiment of the present invention. Referring to FIG. 6 and FIG. 7, at an input time T1, the control unit 160 outputs multiple control signals to respectively control the input switching elements such that the first input switching element 180a and the sixth switching element 180f are turned on to transmit the signals of the common input pads 190a and 190b to the first input terminal 123a and the sixth input terminal 123f, respectively. At the input time T1, the control unit 160 controls the remaining switching elements to turn off to prevent the signals of the common input pads 190a and 190b to interfere with other input terminals of the core circuit unit 120. Similarly, at an input time T2, the control unit 160 controls the switching elements 180a to 180g to transmit the signals of common input pads 190a and 190b to the second input terminal 123b and the seventh input terminal 123g, respectively. At an input time T3, the control unit 160 controls the switching elements 180a to 180g to transmit the signals of common input pads 190a and 190b to the third input terminal 123c and the sixth input terminal 123f, respectively. At an input time T4, the control unit 160 controls the switching elements 180a to 180g to transmit the signals of common input pads 190a and 190b to the fourth input terminal 123d and the seventh input terminal 123g, respectively. At an input time T5, the control unit 160 controls the switching elements 180a to 180g to transmit the signals of common input pads 190a and 190b to the fifth input terminal 123e and the sixth input terminal 123f, respectively. As such, the input signals of the tester are inputted to the multiple input terminals of the core circuit unit 120 for testing and verification in a time-division multiplexing and one-to-many manner through the common input pads, thereby reducing the overall number of the input pads and hence increasing the compatibility of the corresponding tester. Here, the sequence in which the first to seventh switching elements 180a to 180g are turned on can be determined according to actual test requirements and should not be limited any particular sequence discussed herein.

After the test stage ends, the flexible substrate 110 may be cut along the cut line 111 to remove the cutting-out areas 115a and 115b. After the cutting-out areas 115a and 115b are removed, the core circuit unit 120 in the non-cutting-out area 113 may be coupled to a printed circuit board or any other type of mainboard (not shown) through the input pads 170a to 170g. In the normal operation stage, the common input pads 190a and 190b in the cutting-out area 115b and associated parallel paths have been removed, and the control circuit 160 outputs multiple control signals to control the first to seventh input switching elements 180a to 180g to all turn on, such that the mainboard may input the input signals to the first to seventh input terminals 123a to 123g of the core circuit unit 120 through the first to seventh input pads 170a to 170g, respectively.

In summary, in various embodiments described above, in the test stage, the multiple switching elements are controlled to sequentially turn on so as to alternatively transmit the multiple output signals of the core circuit unit disposed in the non-cutting-out area to the common test pads disposed in the cutting-out area, thereby achieving the test operation in the time-division multiplexing and many-to-one manner. In some other embodiments, in the test stage, the multiple input switching elements are controlled to sequentially turn on so as to alternatively transmit the input signals of the common input pads disposed in the cutting-out area to the multiple input terminals of the core circuit unit, thereby achieving the test/verification operation in the time-division multiplexing and one-to-many manner. After the common test pads and common input pads are removed, during the normal operation stage, the multiple switching elements and input switching elements are controlled to all turn on to return to the normal input and output state. The above embodiments can reduce the overall number of the output test pads and input test pads and hence increase the compatibility of the tester to the electronic device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device with chip-on-film package, comprising:
   a flexible substrate;
   a core circuit unit disposed in the flexible substrate;
   multiple switching elements comprising a first switching element and a second switching element, wherein a first terminal of the first switching element is electrically connected to a first output terminal of the core circuit unit, and a first terminal of the second switching element is electrically connected to a second output terminal of the core circuit unit; and
   multiple output pads disposed in the flexible substrate, wherein the multiple output pads comprise a first output pad and a second output pad, the first output pad is electrically connected to a second terminal of the first switching element, the first output pad is electrically connected to the first output terminal of the core circuit unit through the first switching element when the first switching element is turned on, the second output pad is electrically connected to a second terminal of the second switching element, and the second output pad is electrically connected to the second output terminal of the core circuit unit through the second switching element when the second switching element is turned on;
   wherein, in a test stage of the electronic device, the switching elements are sequentially turned on in different time such that one of multiple output signals of the core circuit unit is transmitted to a common test pad outside of the electronic device through corresponding one of the output pads.

2. The electronic device according to claim 1, wherein in a normal operation stage, the switching elements are all turned on.

3. The electronic device according to claim 1, further comprising a control circuit disposed in the flexible substrate, the control circuit outputting multiple control signals to control these switching elements.

4. The electronic device according to claim 1, wherein the switching elements are tri-stage buffers or transmission gates.

5. The electronic device according to claim 1, wherein one of the switching elements comprises:
   a first transistor, wherein a first terminal of the first transistor is coupled to a system voltage, and a second terminal of the first transistor is coupled to one of the output pads;
   a second transistor, wherein a first terminal of the second transistor is coupled to the second terminal of the first transistor, and a second terminal of the second transistor is coupled to a ground voltage;
   a first switch, wherein a first terminal of the first switch is coupled to the system voltage, and a second terminal of the first switch is coupled to a control terminal of the first transistor;

a second switch, wherein a first terminal of the second switch is coupled to a control terminal of the second transistor, and a second terminal of the second switch is coupled to the ground voltage;

a third switch, wherein a first terminal of the third switch is coupled to the core circuit unit, and a second terminal of the third switch is coupled to the control terminal of the first transistor; and a fourth switch, wherein a first terminal of the fourth switch is coupled to the control terminal of the second transistor, and a second terminal of the fourth switch is coupled to the core circuit unit.

6. The electronic device according to claim 1, wherein output terminals of the switching elements are electrically connected to the common test pad through different film leads.

7. The electronic device according to claim 1, further comprising:

multiple input pads disposed in the flexible substrate, wherein the input pads comprises a first input pad and a second input pad; and multiple input switching elements comprising a first input switching element and a second input switching element, wherein a first terminal and a second terminal of the first input switching element are electrically connected to a first input terminal of the core circuit unit and the first input pad, respectively, and a first terminal and a second terminal of the second input switching element are electrically connected to a second input terminal of the core circuit unit and the second input pad;

wherein, in a test stage of the electronic device, the input switching element are sequentially turned on such that a common input pad disposed outside of the electronic device is electrically connected to one of multiple input terminals of the core circuit unit through corresponding one of the input pads.

8. The electronic device according to claim 7, wherein, in the test stage, the input switching elements are sequentially turned on, such that the signal of the common input pad is transmitted to one of multiple input terminals of the core circuit unit.

9. The electronic device according to claim 8, wherein, in a normal operation stage, the input switching elements are all turned on.

* * * * *